(12) United States Patent
Lai (10) Patent No.: US 12,482,693 B2
(45) Date of Patent: Nov. 25, 2025

(54) LIGHT-EMITTING DEVICE ARRAY SUBSTRATE AND METHOD FOR FABRICATING THE SAME

(71) Applicant: AUO Corporation, Hsinchu (TW)

(72) Inventor: Shih-Lun Lai, Hsinchu (TW)

(73) Assignee: AUO Corporation, Hsinchu (TW)

( * ) Notice: Subject to any disclaimer, the term of this patent is extended or adjusted under 35 U.S.C. 154(b) by 404 days.

(21) Appl. No.: 18/180,860

(22) Filed: Mar. 9, 2023

(65) Prior Publication Data

US 2023/0317499 A1 Oct. 5, 2023

Related U.S. Application Data

(60) Provisional application No. 63/326,437, filed on Apr. 1, 2022.

(30) Foreign Application Priority Data

Aug. 5, 2022 (TW) .................................. 111129479

(51) Int. Cl.
*H01L 21/683* (2006.01)
*H10H 20/01* (2025.01)
*H01L 25/075* (2006.01)

(52) U.S. Cl.
CPC ....... *H01L 21/6835* (2013.01); *H10H 20/018* (2025.01); *H01L 25/0753* (2013.01); *H01L 2221/68368* (2013.01)

(58) Field of Classification Search
None
See application file for complete search history.

(56) References Cited

U.S. PATENT DOCUMENTS

| 10,431,569 | B2 | 10/2019 | Li et al. | |
|---|---|---|---|---|
| 2017/0170049 | A1* | 6/2017 | Hu | ....... H01L 21/6835 |
| 2018/0294387 | A1 | 10/2018 | Li et al. | |
| 2021/0135042 | A1* | 5/2021 | Wei | ....... H01L 25/0753 |

FOREIGN PATENT DOCUMENTS

| CN | 112435942 | 3/2021 |
|---|---|---|
| TW | 201838046 | 10/2018 |

\* cited by examiner

*Primary Examiner* — Bradley Smith
(74) *Attorney, Agent, or Firm* — JCIPRNET (57) ABSTRACT

A light-emitting device array substrate includes a carrier, a plurality of adhesive patterns, and a plurality of light-emitting devices. The adhesive patterns are arranged in an array on the carrier. Each of the light-emitting devices is disposed on a first adhesive pattern among the adhesive patterns. An area of a first surface of each of the first adhesive patterns adjacent to the light-emitting device is less than or equal to an area of a second surface of the light-emitting device adjacent to the first adhesive pattern. A method for fabricating a light-emitting device array substrate is also proposed.

14 Claims, 9 Drawing Sheets

LIGHT-EMITTING DEVICE ARRAY SUBSTRATE AND METHOD FOR FABRICATING THE SAME

CROSS-REFERENCE TO RELATED APPLICATION

This application claims the priority benefit of U.S. provisional application Ser. No. 63/326,437, filed on Apr. 1, 2022, and Taiwan application serial no. 111129479, filed on Aug. 5, 2022. The entirety of each of the above-mentioned patent applications is hereby incorporated by reference herein and made a part of this specification.

BACKGROUND

Technical Field

The disclosure relates to a light-emitting device array substrate and a method for fabricating the same.

Description of Related Art

At present, since the size of a micro light-emitting diode (LED) is excessively small, multiple mass transfer techniques are used to fabricate micro-LED light-emitting device array substrates, so as to gradually transfer the micro-LED dies to the driving substrate with pixel circuits. The micro-LED dies are temporarily fixed on different temporary carriers through an adhesive material.

During the process of transferring a die to the target carrier, die separation can be accomplished using laser transfer techniques. Further, the generated impact force or driving force may cause the die to be detached and push the die to transfer to the target carrier, and the die is then attached to the adhesive material of the target carrier. However, the uneven distribution of the impact force or driving force may cause the die to be unable to be accurately transferred to the predetermined position on the target carrier, and defects such as die skew or cracking may also occur. Since these defects may affect the subsequent welding process, at present, an automatic optical inspection machine is required to be additionally used to conduct comprehensive scanning to find the defects, and laser is then used to remove the defects, resulting in increased fabrication hours and increased costs.

SUMMARY

The disclosure provides a light-emitting device array substrate requiring reduced costs.

The disclosure further provides a method for fabricating a light-emitting device array substrate requiring reduced fabrication hours.

An embodiment of the disclosure provides a light-emitting device array substrate including a carrier, a plurality of adhesive patterns arranged in an array on the carrier, and a plurality of light-emitting devices. Each of the light-emitting devices is disposed on a first adhesive pattern among the adhesive patterns. An area of a first surface of each of the first adhesive patterns adjacent to the light-emitting device is less than or equal to an area of a second surface of the light-emitting device adjacent to the first adhesive pattern.

In an embodiment of the disclosure, the area of the first surface is greater than or equal to 4% of the area of the second surface.

In an embodiment of the disclosure, a spacing between a symmetrical center of each adhesive pattern and a geometric center of the light-emitting device is not greater than 10% of a length of the light-emitting device.

In an embodiment of the disclosure, the adhesive patterns are separated from one another.

In an embodiment of the disclosure, each of the adhesive patterns has an opening.

In an embodiment of the disclosure, each of the adhesive patterns has a trench.

In an embodiment of the disclosure, second adhesive patterns among the adhesive patterns are not provided with the light-emitting devices.

In an embodiment of the disclosure, the light-emitting device array substrate further includes an adhesive material covering the light-emitting devices.

An embodiment of the disclosure further provides a method for fabricating a light-emitting device array substrate, and the method includes the following steps. A first carrier is provided. A plurality of light-emitting devices are disposed on the first carrier. A second carrier is provided, A plurality of adhesive patterns are arranged in an array on the second carrier. The light-emitting devices are transferred from the first carrier to the second carrier, and each of first light-emitting devices among the light-emitting devices is arranged on a first adhesive pattern among the adhesive patterns. An area of a first surface of each of the first adhesive patterns adjacent to the first light-emitting device is less than or equal to an area of a second surface of the first light-emitting device adjacent to the first adhesive pattern.

In an embodiment of the disclosure, the light-emitting devices are disposed on the first carrier through an adhesive material.

In an embodiment of the disclosure, the method for fabricating the light-emitting device array substrate further includes the following step. The adhesive material is removed after the light-emitting devices are transferred from the first carrier to the second carrier.

In an embodiment of the disclosure, portions of the adhesive patterns are removed at the same time when the adhesive material is removed.

In an embodiment of the disclosure, the area of the first surface is reduced by 5% to 50% after the adhesive material is removed.

In an embodiment of the disclosure, second light-emitting devices among the first light-emitting devices are removed at the same time when the adhesive material is removed.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

In the accompanying drawings, thicknesses of layers, films, panels, regions, and so on are exaggerated for clarity. Throughout the specification, the same reference numerals in the accompanying drawings denote the same elements. It should be understood that when an element such as a layer, film, region or substrate is referred to as being "on" or "connected to" another element, it means that the element is directly on or connected to the another element, or an intervening element may be provided therebetween. In contrast, when an element is referred to as being "directly on" or "directly connected to" another element, it means that no intervening element is provided therebetween. As used herein, the term "connected" may refer to physical connection and/or electrical connection. Further, the "electrical connection" or "coupling" may be that other elements are provided between two elements.

It should be understood that, although the terms "first", "second", "third", etc., may be used herein to describe various elements, components, regions, layers and/or portions, these elements, components, regions, layers, and/or portions should not be limited by these terms. These terms are used to distinguish one element, component, region, layer, or portion from another element, component, region, layer, or portion. Therefore, the first "element", "component", "region", "layer", or "portion" discussed below may be referred to as the second element, component, region, layer, or portion without departing from the teachings of the specification.

The terminology used herein is for the purpose of describing particular embodiments only and is not intended to be limiting. As used herein, unless clearly indicated otherwise, the singular forms of "a", "one", and "the" in the content are intended to include plural forms, including "at least one" or "and/or". The term "and/or" used herein includes any or a combination of one or more of the associated listed items. It will be further understood that the terms "comprises", "comprising", "includes", and/or "including" when used in the specification specify the presence of stated features, regions, integers, steps, operations, elements, and/or components, but do not preclude the presence or addition of one or more other features, regions, integers, steps, operations, elements, components, and/or groups thereof.

Moreover, relative terms such as "below" or "bottom" and "above" or "top" may serve to describe the relation between one element and another element in the specification as shown in the drawings. It should also be understood that the relative terms are intended to include different orientations of a device in addition to the orientation shown in the drawings. For example, if a device in the drawings is flipped, an element originally described as being disposed "below" other elements shall be orientated to be "above" other elements. Therefore, the exemplary term "below" may cover the orientations of "below" and "above", depending on the specific orientation of the drawings. Similarly, if a device in the drawing is flipped over, an element originally described to be located "below" or "underneath" other elements is oriented to be located "on" the other elements. Therefore, the exemplary term "below" or "underneath" may include orientations of "above" and "below".

The terms used herein such as "about", "approximate", or "substantial" include a related value and an average within an acceptable deviation range of specific values determined by those with ordinary skills in the art with consideration of discussed measurement and a specific number of errors related to the measurement (i.e., a limitation of a measurement system). For example, "about" may mean within one or more standard deviations, or within, for example, ±30%, ±20%, ±15%, ±10%, and ±5% of the stated value. Moreover, a relatively acceptable range of deviation or standard deviation may be chosen for the term "about", "approximately", or "substantially" as used herein based on optical properties, etching properties or other properties, instead of applying one standard deviation across all the properties.

Unless otherwise defined, all terms (including technical and scientific terms) used herein have the same meaning as commonly understood by a person having ordinary skill in the art. It will be further understood that, terms such as those defined in commonly used dictionaries should be interpreted as having a meaning that is consistent with their meaning in the context of the related art, and these terms are not to be construed in an idealized or excessively formal sense unless explicitly defined as such herein.

Exemplary embodiments are described herein with reference to schematic cross-sectional views illustrating idealized embodiments. Hence, variations of shapes resulting from manufacturing technologies and/or tolerances, for instance, are to be expected. Hence, the embodiments described herein should not be construed as being limited to the particular shapes of regions as illustrated herein but are to include deviations in shapes that result, for example, from manufacturing. For instance, regions shown or described as being flat may typically have rough and/or non-linear features. Besides, the acute angle as shown may be round. Therefore, the regions shown in the drawings are schematic in nature, and their shapes are not intended to show the exact shape of the regions, and are not intended to limit the scope of the claims.

FIG. 1 to FIG. 6 are partial cross-sectional schematic views of steps of a process of a method for fabricating a light-emitting device array substrate 10 according to an embodiment of the disclosure. Hereinafter, a method for fabricating the light-emitting device array substrate 10 is provided with reference to FIG. 1 to FIG. 6.

Figure 1:
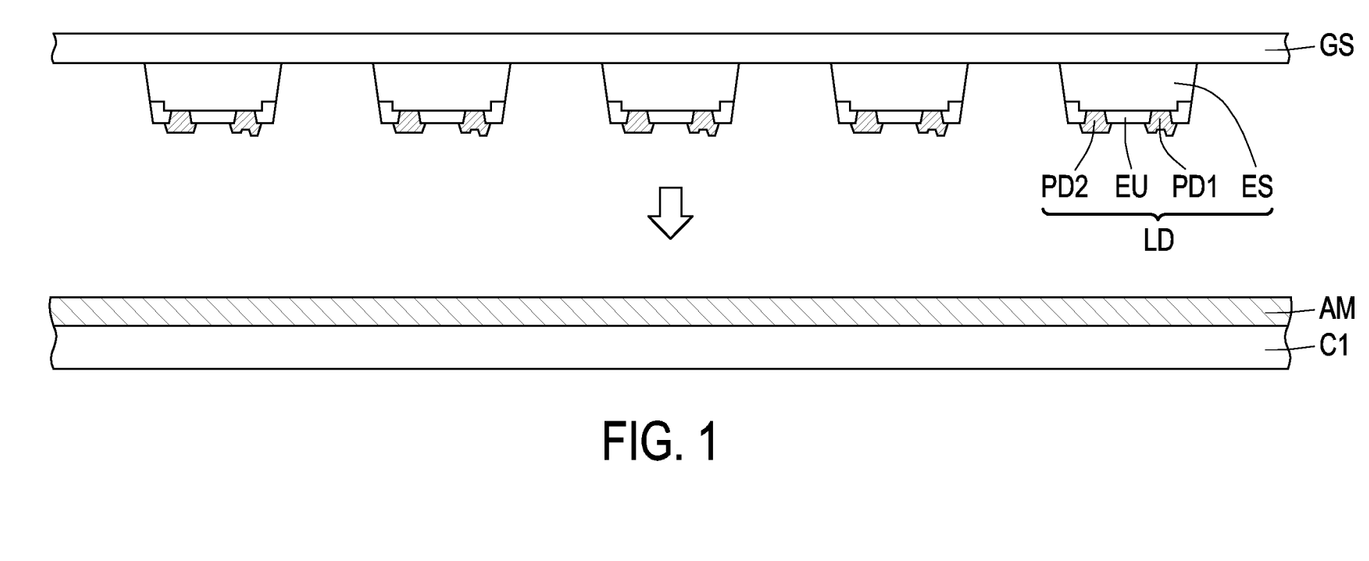
FIG. 1 to FIG. 6 are partial cross-sectional schematic views of steps of a process of a method for fabricating a light-emitting device array substrate 10 according to an embodiment of the disclosure.
Figure 2:
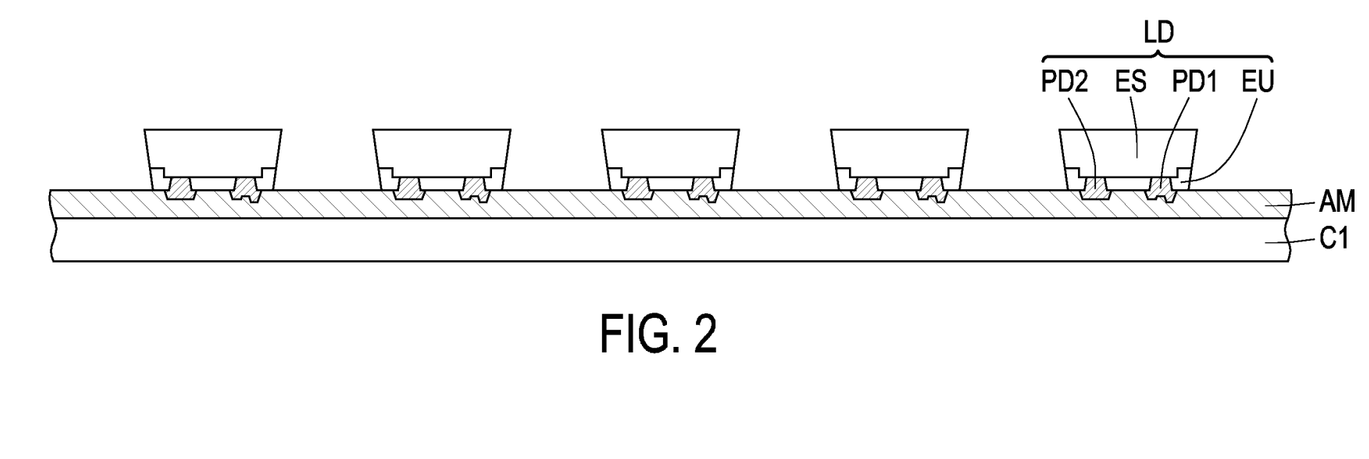

With reference to FIG. 1, a plurality of light-emitting devices LD are transferred from a growth substrate GS to an adhesive material AM on a first carrier C1, so that the light-emitting devices LD are fixed on the first carrier C1 through the adhesive material AM, and the first carrier C1 provided with the plurality of light-emitting devices LD, as shown in FIG. 2, is thus provided.

The layer of adhesive material AM may be pre-formed on the first carrier C1. The first carrier C1 may be a rigid substrate, such as a glass substrate, a quartz substrate, or a ceramic substrate, but the disclosure is not limited thereto. The adhesive material AM may be formed on the first carrier C1 by coating, but the disclosure is not limited thereto. The adhesive material AM may include, for example, an adhesive material such as acrylic resin.

In some embodiments, the light emitting devices LD may be attached to the adhesive material AM first, so that the light emitting devices LD are located between the growth substrate GS and the first carrier C1. Next, the growth substrate GS is removed to expose semiconductor stacked layers ES of the light-emitting devices LD. The method of removing the growth substrate GS may adopt, for example, a laser lift off process, but the disclosure is not limited thereto. With reference to FIG. 2, after each of the light-emitting devices LD is transferred to the first carrier C1, a first pad PD1 and a second pad PD2 of the light-emitting device LD may be adhered to the adhesive material AM, and the first pad PD1 and the second pad PD2 may be located between the semiconductor stacked layer ES and the adhesive material AM.

In detail, the light-emitting devices LD may be formed on the growth substrate GS. The growth substrate GS is, for example, a sapphire substrate, but the disclosure is not limited thereto. In some embodiments, the method for forming each of the light-emitting devices LD may include performing an epitaxial process using appropriate reactants to deposit a desired film. Next, the aforementioned film is patterned by a lithography process and an etching process to form various sub-layers of the light-emitting device LD. In some embodiments, a doping process may also be selectively performed on some sub-layers of the light-emitting device LD.

For instance, in some embodiments, each of the light-emitting devices LD may include the semiconductor stacked layer ES, the first pad PD1, the second pad PD2, and an insulating layer EU. The first pad PD1 and the second pad PD2 are electrically connected to different sub-layers in the semiconductor stacked layer ES. Further, the insulating layer EU may be located between a portion of the first pad PD1 and the semiconductor stacked layer ES and between a portion of the second pad PD2 and the semiconductor stacked layer ES without affecting the electrical connection between the first pad PD1 and the second pad PD2 and the different sub-layers of the semiconductor stacked layer ES. In this embodiment, the first pad PD1 and the second pad PD2 of the light-emitting device LD are located on the same side of the semiconductor stacked layer ES, but the disclosure is not limited thereto. In some embodiments, the first pad PD1 and the second pad PD2 may be located on different sides of the semiconductor stacked layer ES.

For instance, the semiconductor stacked layer ES may include stacked layers of a P-type doped semiconductor layer, a multi quantum well (MQW) structure, and an N-type doped semiconductor layer, and the MQW structure may be located between the P-type doped semiconductor layer and the N-type doped semiconductor layer. The material of the P-type doped semiconductor layer is, for example, a P-type II-VI group material (e.g., zinc selenide (ZnSe)), a P-type III-V group nitride material (e.g., gallium nitride (GaN), aluminum nitride (AlN), indium nitride (InN), indium gallium nitride (InGaN), aluminum gallium nitride (AlGaN), or aluminum indium gallium nitride (AlInGaN)), or a stacked layer thereof. The material of the N-type doped semiconductor layer is, for example, an N-type II-VI group material, an N-type III-V group nitride material, or a stacked layer thereof. The MQW structure may include multiple layers of II-VI group materials and multiple layers of III-V group nitride materials stacked in an alternating manner, but the disclosure is not limited thereto. The material of the first pad PD1 and the second pad PD2 may include, for example, metal (e.g., tin), alloy, nitride of metal materials, oxide of metal materials, oxynitride of metal materials, graphene, stacked layers of metal materials, or stacked layers of other conductive materials.

Figure 3:
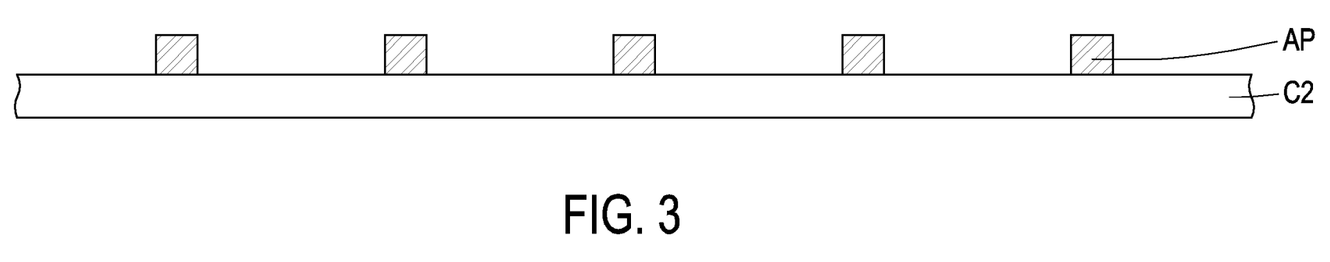

With reference to FIG. 3, a second carrier C2 is provided, and a plurality of adhesive patterns AP are arranged on the second carrier C2. The second carrier C2 may be a glass substrate, a quartz substrate, or a ceramic substrate, but the disclosure is not limited thereto. The adhesive patterns AP may be arranged in an array, and the adhesive patterns AP may be separated from one another. For instance, the lateral spacings or vertical spacings among the adhesive patterns AP may be equal.

The method of forming the adhesive patterns AP is not particularly limited. For instance, a blanket adhesive layer may be coated on the second carrier C2 first, and then the blanket adhesive layer may be patterned to form the adhesive patterns AP. In some embodiments, the blanket adhesive layer may be formed through spin coating, and the patterning may be performed by exposure and development processes. The adhesive patterns AP may include adhesive materials such as acrylic resin.

Figure 4:
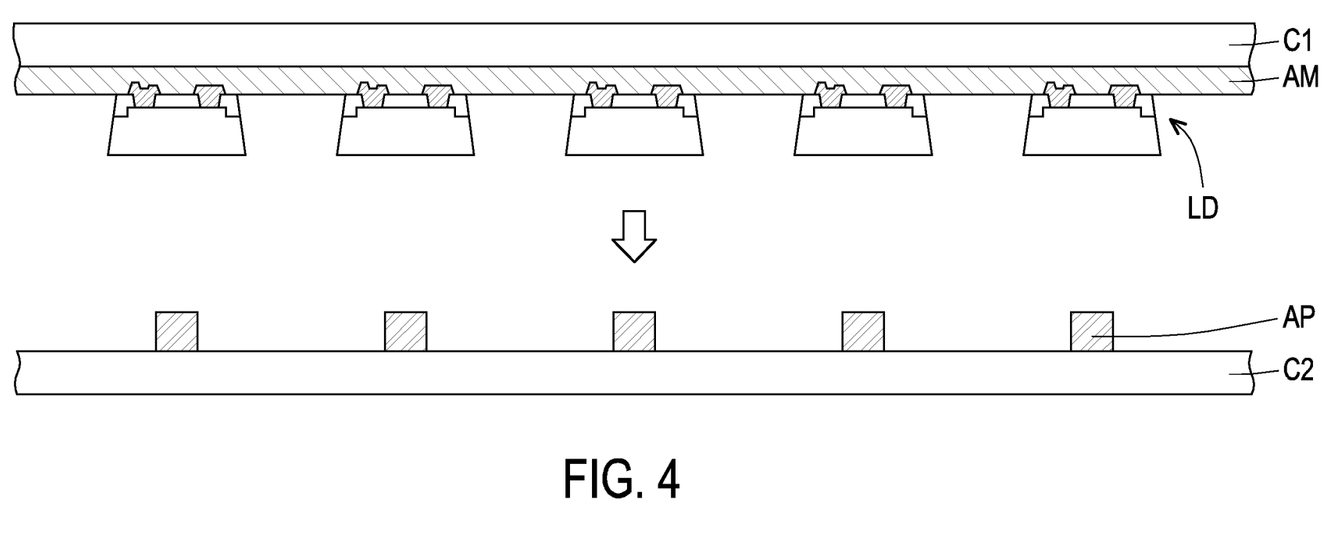
Figure 5:
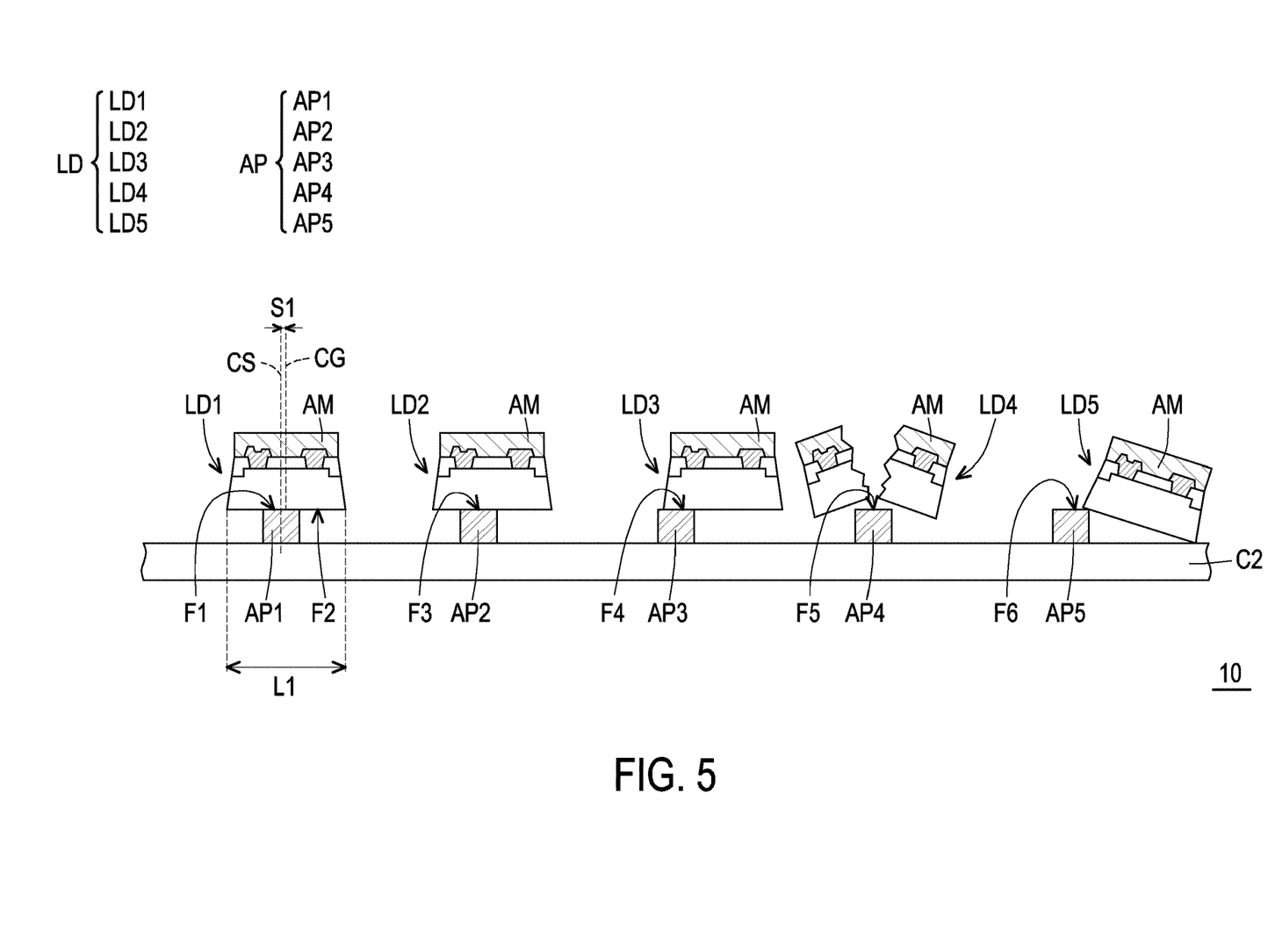

With reference to FIG. 4, the plurality of light-emitting devices LD are transferred from the first carrier C1 to the second carrier C2, and most of the light-emitting devices LD among the plurality of light-emitting devices LD are arranged on the adhesive patterns AP to form the light-emitting device array substrate 10 as shown in FIG. 5. For instance, a laser lift off process may be used to separate the light-emitting devices LD from the first carrier C1, so that the light-emitting devices LD are transferred onto the adhesive patterns AP.

With reference to FIG. 5, after the laser lift off process, the adhesive material AM attached to the light-emitting devices LD may be detached from the first carrier C1 together with the light-emitting devices LD, so that the light-emitting devices LD detached from the first carrier C1 may be covered with the adhesive material AM.

In this embodiment, a light-emitting device LD1 among the light-emitting devices LD may be adhered onto an adhesive pattern AP1 among the adhesive patterns AP. Further, an area of a surface F1 of the adhesive pattern AP1 adjacent to the light-emitting device LD1 is less than or equal to an area of a surface F2 of the light-emitting device LD1 adjacent to the adhesive pattern AP1. In some embodiments, the area of the surface F1 of the adhesive pattern AP1 may be greater than or equal to 4% of the area of the surface F2 of the light-emitting device LD1. In some embodiments, a spacing S1 between a symmetrical center CS of the adhesive pattern AP1 and a geometric center CG of the light-emitting device LD1 is not greater than 10% of a length L1 of the light-emitting device LD1. In some embodiments, the spacing between the symmetrical center CS of the adhesive pattern AP1 and the geometric center CG of the light-emitting device LD1 is not greater than 5 μm. In this way, the adhesive pattern AP1 may support the light-emitting device LD1 with sufficient stability, so that the alignment accuracy of the light-emitting device LD1 is ensured.

Besides, after the transfer, light-emitting devices LD2 and LD3 among the light-emitting devices LD may be slightly offset. As a result, the spacing between the symmetrical center of an adhesive pattern AP2 and the geometric center of the light-emitting device LD2 is greater than 10% of the length of the light-emitting device LD2 or the light-emitting device LD3, and the offset of the light-emitting device LD3 may even be greater than the offset of the light-emitting device LD2. Further, the light-emitting device LD3 may not completely cover an adhesive pattern AP3. However, the adhesive patterns AP2 and AP3 may still support the light-emitting devices LD2 and LD3 respectively thereon.

In addition, a light-emitting device LD4 among the light-emitting devices LD may not be able to withstand the impact of the laser lift off process due to growth defects, so crystal cracks occur after the transfer, and the light-emitting device LD4 cannot be supported on an adhesive pattern AP4. As for a light-emitting device LD5 among the light-emitting devices LD, since the offset thereof is excessively large and the proportion of the overlapping an adhesive pattern AP5 is excessively small, the light-emitting device LD5 may fall obliquely on one side of the adhesive pattern AP5 after the transfer. Therefore, the light-emitting devices LD4 and LD5 cannot be disposed on the second carrier C2 through the adhesive patterns AP4 and AP5, and there is no light-emitting device LD on the adhesive patterns AP4 and AP5. In other words, by making the area of the surface F1 of the adhesive pattern AP smaller than or equal to the area of the surface F2 of the light-emitting device LD, the defective light-emitting device LD4 as well as the light-emitting device LD5 with an excessively large offset, for example, may be screened out.

Figure 6:
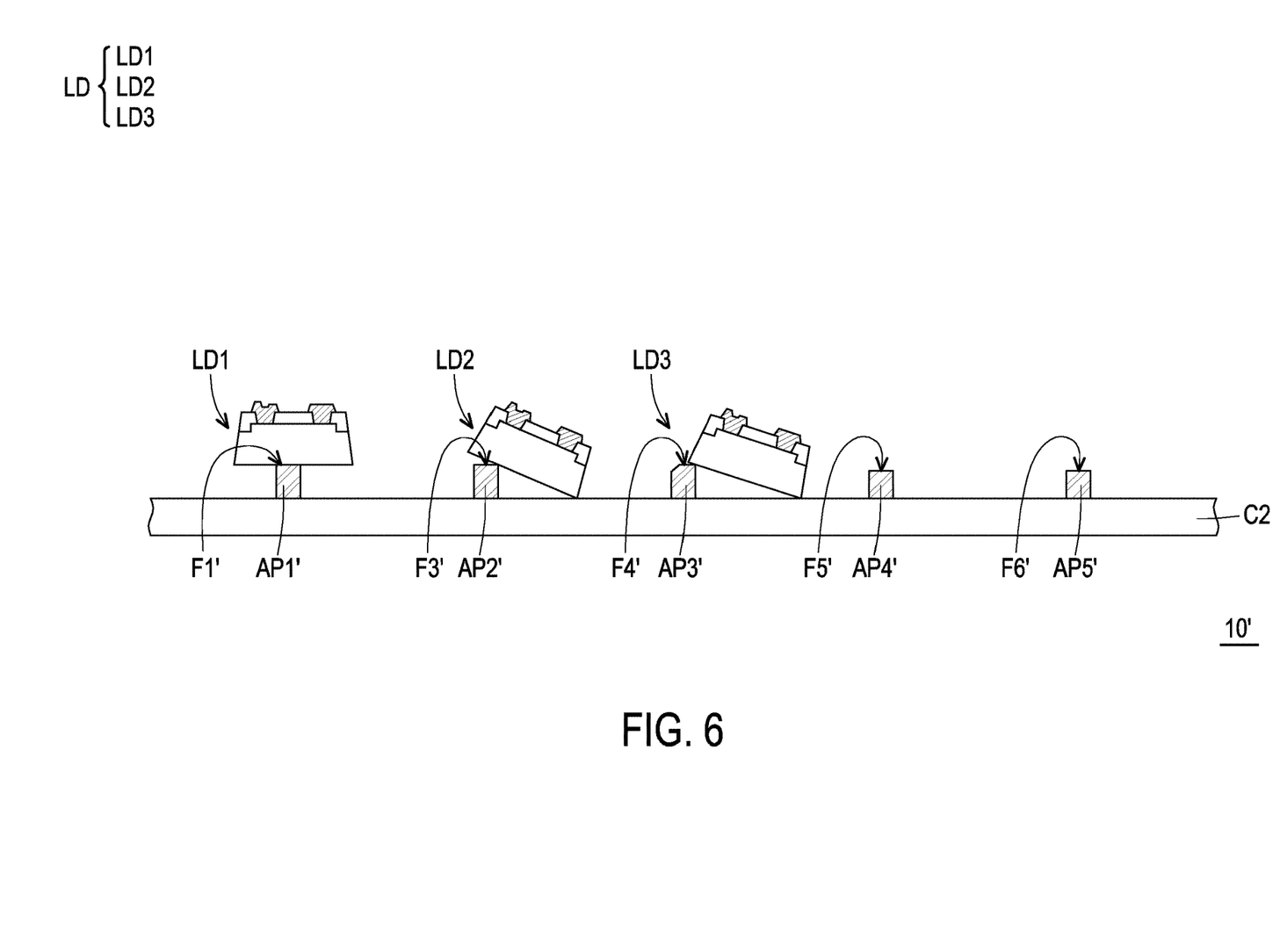

In some embodiments, after the light-emitting devices LD are transferred from the first carrier C1 to the second carrier C2, the adhesive material AM on the light-emitting devices LD may further be removed to form a light-emitting device array substrate 10' as shown in FIG. 6.

In some embodiments, a portion of each of the adhesive patterns AP may also be removed at the same time when the adhesive material AM is removed. For instance, with reference to FIG. 5 and FIG. 6, when the adhesive material AM on the light-emitting devices LD is removed, a portion of each of the adhesive patterns AP1, AP2, AP3, AP4, and AP5 is removed to become adhesive patterns AP1', AP2', AP3', AP4', and AP5'. For instance, 5% to 50% of the area of the surface F1 of the adhesive pattern AP1 may be removed to become the adhesive pattern AP1'. In other words, the area of the surface F1' of the adhesive pattern AP1' may account for 50% to 95% of the area of the surface F1 of the adhesive pattern AP1. Similarly, the areas of the surfaces F3', F4', F5', and F6' of the adhesive patterns AP2', AP3', AP4', and AP5' may respectively account for 50% to 95% of the areas of the surfaces F3, F4, F5, and F6 of the adhesive patterns AP2, AP3, AP4, and AP5. For instance, the areas of the surfaces F1', F3', F4', F5', and F6' of the adhesive patterns AP1', AP2', AP3', AP4', and AP5' may respectively account for 70%, 80%, or 90% of the areas of the surfaces F1, F3, F4, F5, and F6 of the adhesive patterns AP1, AP2, AP3, AP4, and AP5. As such, since the areas of the supporting surfaces F3' and F4' of the adhesive patterns AP2' and AP3' are reduced, the light-emitting devices LD2 and LD3 can no longer be respectively supported on the surfaces F3' and F4' of the adhesive patterns AP2' and AP3'. In other words, the light-emitting devices LD2 and LD3 may be removed at the same time when the adhesive material AM is removed. Finally, the light-emitting device array substrate 10' only includes the light-emitting device LD1 with high transfer accuracy, and there is no light-emitting device LD on the adhesive patterns AP2', AP3', AP4', and AP5'. Therefore, by allowing the adhesive patterns AP to be reduced at the same time when the adhesive material AM is removed, the light-emitting devices LD2 and LD3 with large offsets may be further removed without additional processes, and only the light-emitting device LD1 with high transfer accuracy and supported by the reduced adhesive pattern AP1' is left.

Hereinafter, the description of other embodiments of the disclosure will be continued with reference to FIG. 7A to FIG. 11B. Moreover, it should be noted that the reference numerals and related content in the embodiments of FIG. 1 to FIG. 6 are also used, in which the same reference numerals are used to represent identical or similar devices, and descriptions of the same technical contents are omitted. Please refer to the descriptions of the embodiments of FIG. 1 to FIG. 6 for the omitted contents, which will not be repeated hereinafter.

Figure 7A:
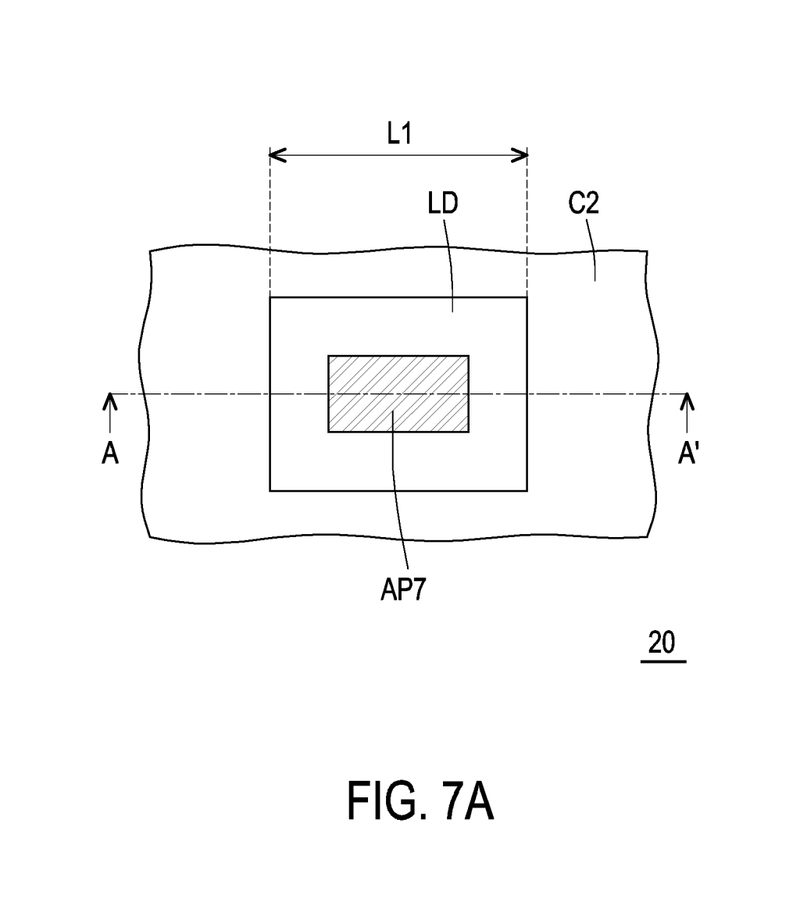
FIG. 7A is a partial schematic top view of a light-emitting device array substrate 20 according to an embodiment of the disclosure.
Figure 7B:
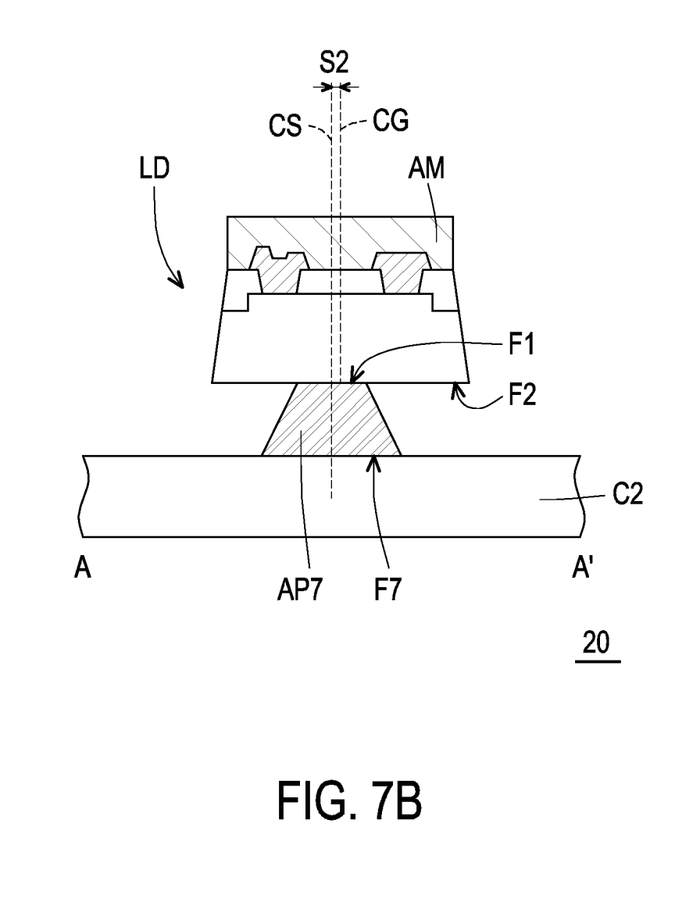
FIG. 7B is a cross-sectional schematic view taken long a cross-sectional line A-A' in FIG. 7A.

FIG. 7A is a partial schematic top view of a light-emitting device array substrate 20 according to an embodiment of the disclosure. FIG. 7B is a cross-sectional schematic view taken long a cross-sectional line A-A' in FIG. 7A. With reference to FIG. 7A to FIG. 7B, the light-emitting device array substrate 20 includes the carrier C2, a plurality of adhesive patterns AP7, and the plurality of light-emitting devices LD. The adhesive patterns AP7 are arranged in an array on the carrier C2. The light-emitting devices LD are disposed on the adhesive patterns AP7. Further, the area of the surface F1 of each adhesive pattern AP7 adjacent to the light-emitting device LD is less than or equal to the area of the surface F2 of the light-emitting device LD adjacent to the adhesive pattern AP7.

The difference between the light-emitting device array substrate 10 shown in FIG. 5 and the light-emitting device array substrate 20 shown in FIG. 7A to FIG. 7B lies in that: on the light-emitting device array substrate 20, the area of the surface F1 of each adhesive pattern AP7 adjacent to the light-emitting device LD is less than the area of the surface F7 of the adhesive pattern AP7 adjacent to the carrier C2. In other words, the area of the surface F1 of the adhesive pattern AP7 may be different from the area of the surface F7. In addition, the orthographic projection of the adhesive pattern AP7 on the carrier C2 completely overlaps the orthographic projection of the light-emitting device LD on the carrier C2. Further, a spacing S2 between the symmetrical center SC of each adhesive pattern AP7 and the geometric center CG of the light-emitting device LD may be approximately 5% of the length L1 of the light-emitting device LD. Therefore, the adhesive pattern AP7 can stably support the light-emitting device LD.

Figure 8A:
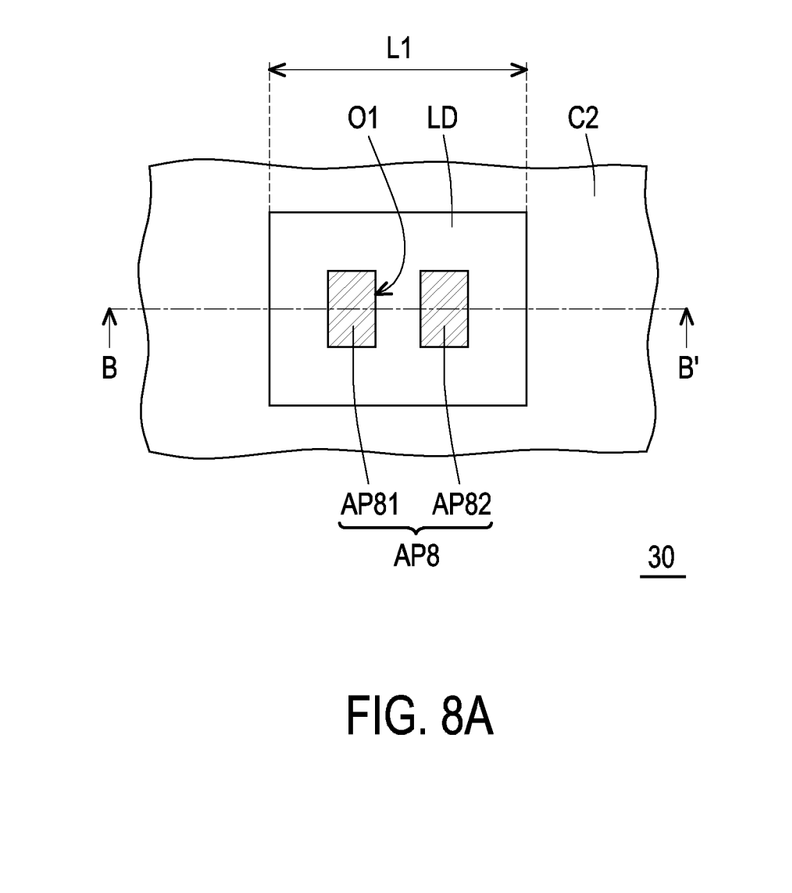
FIG. 8A is a partial schematic top view of a light-emitting device array substrate 30 according to an embodiment of the disclosure.
Figure 8B:
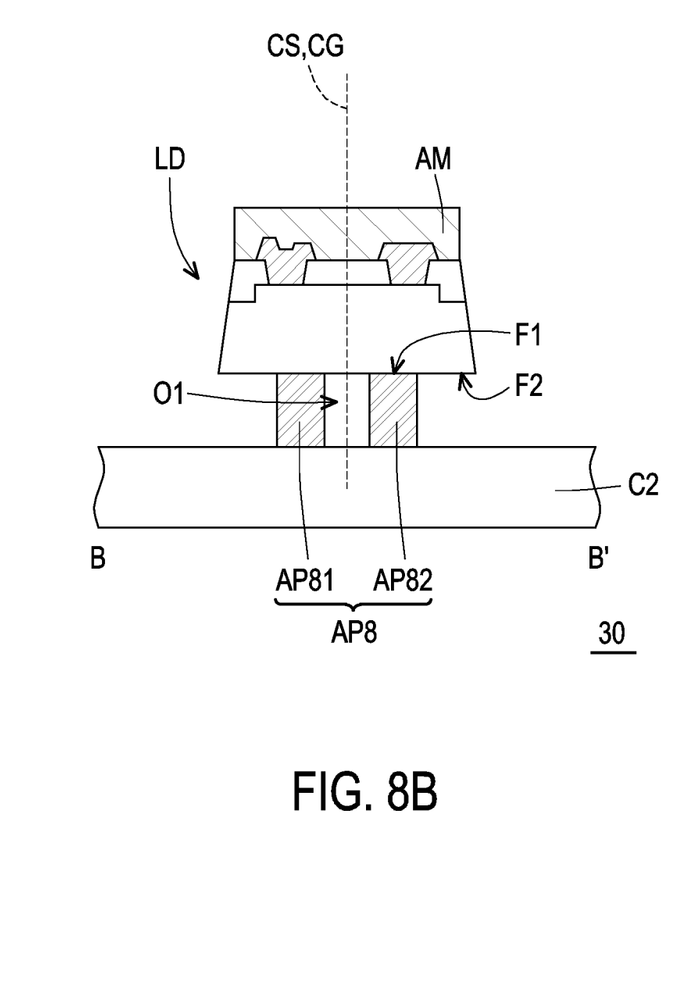
FIG. 8B is a cross-sectional schematic view taken long a cross-sectional line B-B' in FIG. 8A.

FIG. 8A is a partial schematic top view of a light-emitting device array substrate 30 according to an embodiment of the disclosure. FIG. 8B is a cross-sectional schematic view taken long a cross-sectional line B-B' in FIG. 8A. With reference to FIG. 8A to FIG. 8B, the light-emitting device array substrate 30 includes the carrier C2, a plurality of adhesive patterns AP8, and the plurality of light-emitting devices LD. The adhesive patterns AP8 are arranged in an array on the carrier C2. The light-emitting devices LD are disposed on the adhesive patterns AP8. Further, the area of the surface F1 of each adhesive pattern AP8 adjacent to the light-emitting device LD is less than or equal to the area of the surface F2 of the light-emitting device LD adjacent to the adhesive pattern AP8.

The difference between the light-emitting device array substrate 10 shown in FIG. 5 and the light-emitting device array substrate 30 shown in FIG. 8A to FIG. 8B lies in that:

on the light-emitting device array substrate 30, each adhesive pattern AP8 may have an opening O1, and the opening O1 may penetrate through the adhesive pattern AP8 and divide the adhesive pattern AP8 into a first portion AP81 and a second portion AP82. In this way, when the spacing between the symmetrical center CS of the adhesive pattern AP8 and the geometric center CG of the light-emitting device LD is not greater than 10% of the length L1 of the light-emitting device LD, the adhesive pattern AP8 may still stably support the light-emitting device LD. In some embodiments, the areas of the first portion AP81 and the second portion AP82 of the adhesive pattern AP8 adjacent to the surface of the light-emitting device LD may be similar or equal. In some embodiments, the symmetrical center CS of the adhesive pattern AP8 may overlap the geometric center CG of the light-emitting device LD. Further, the orthographic projection of the adhesive pattern AP8 on the carrier C2 may completely overlap the orthographic projection of the light-emitting device LD on the carrier C2.

Figure 9A:
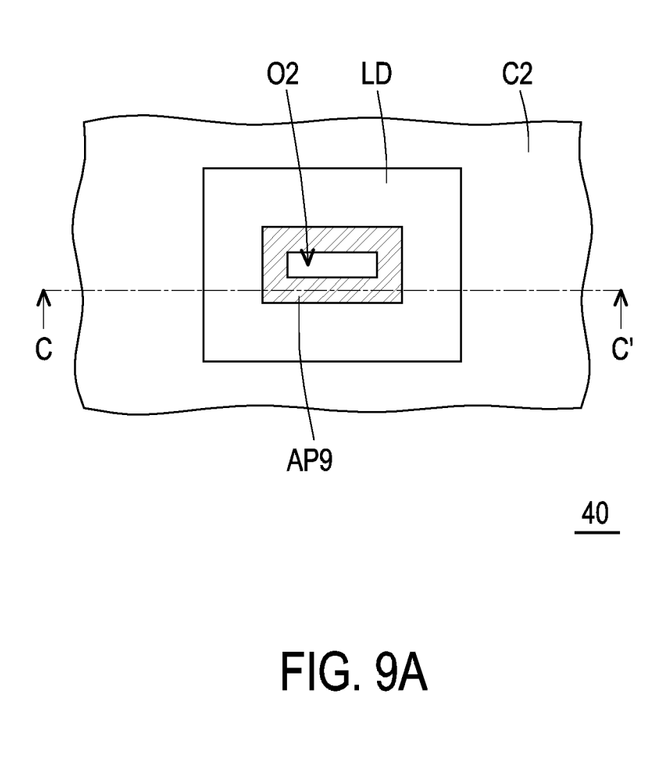
FIG. 9A is a partial schematic top view of a light-emitting device array substrate 40 according to an embodiment of the disclosure.
Figure 9B:
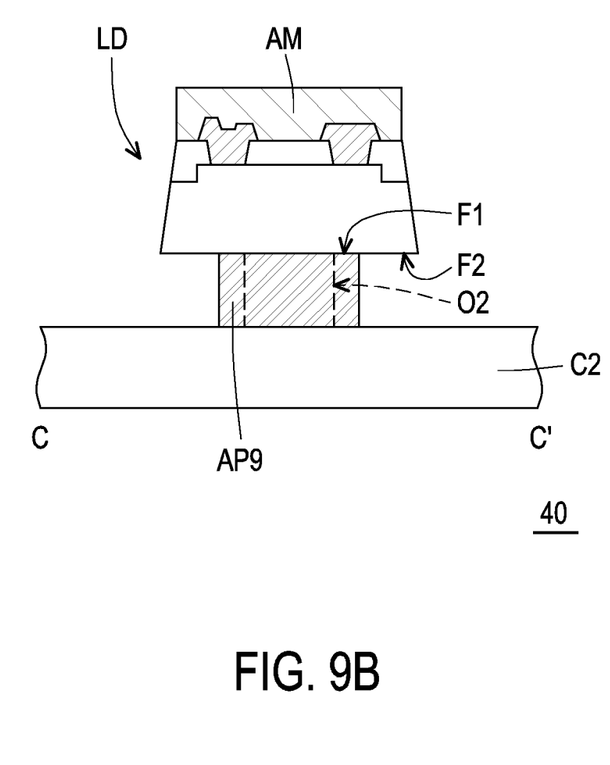
FIG. 9B is a cross-sectional schematic view taken long a cross-sectional line C-C' in FIG. 9A.

FIG. 9A is a partial schematic top view of a light-emitting device array substrate 40 according to an embodiment of the disclosure. FIG. 9B is a cross-sectional schematic view taken long a cross-sectional line C-C' in FIG. 9A. With reference to FIG. 9A to FIG. 9B, the light-emitting device array substrate 40 includes the carrier C2, a plurality of adhesive patterns AP9, and the plurality of light-emitting devices LD. The adhesive patterns AP9 are arranged in an array on the carrier C2. The light-emitting devices LD are disposed on the adhesive patterns AP9. Further, the area of the surface F1 of each adhesive pattern AP9 adjacent to the light-emitting device LD is less than or equal to the area of the surface F2 of the light-emitting device LD adjacent to the adhesive pattern AP9.

The difference between the light-emitting device array substrate 10 shown in FIG. 5 and the light-emitting device array substrate 40 shown in FIG. 9A to FIG. 9B lies in that: each adhesive pattern AP9 of the light-emitting device array substrate 40 may have a closed opening O2, and the adhesive pattern AP9 may surround the opening O2. Besides, in this embodiment, the area of the surface F1 of the adhesive pattern AP9 may be greater than the projected area of the closed opening O2 on the carrier C2, so as to ensure that the adhesive pattern AP9 may not be completely removed during subsequent removal of the adhesive material AM.

Figure 10A:
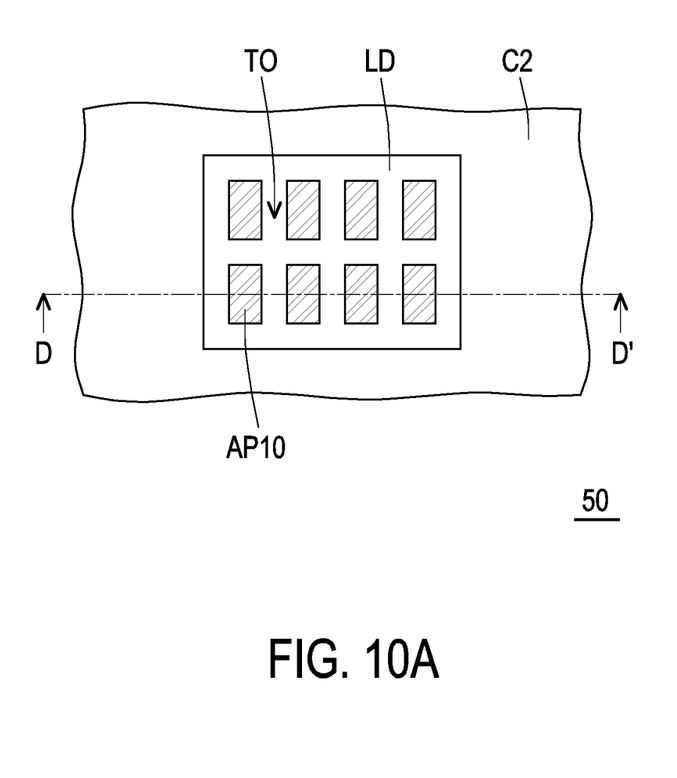
FIG. 10A is a partial schematic top view of a light-emitting device array substrate 50 according to an embodiment of the disclosure.
Figure 10B:
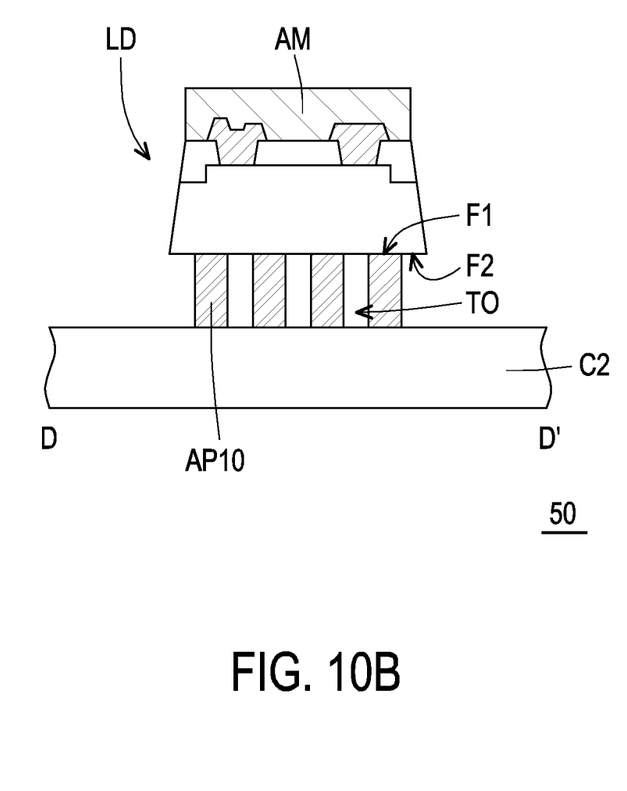
FIG. 10B is a cross-sectional schematic view taken long a cross-sectional line D-D' in FIG. 10A.

FIG. 10A is a partial schematic top view of a light-emitting device array substrate 50 according to an embodiment of the disclosure. FIG. 10B is a cross-sectional schematic view taken long a cross-sectional line D-D' in FIG. 10A. With reference to FIG. 10A to FIG. 10B, the light-emitting device array substrate 50 includes the carrier C2, a plurality of adhesive patterns AP10, and the plurality of light-emitting devices LD. The adhesive patterns AP10 are arranged in an array on the carrier C2. The light-emitting devices LD are disposed on the adhesive patterns AP10. Further, the area of the surface F1 of each adhesive pattern AP10 adjacent to the light-emitting device LD is less than or equal to the area of the surface F2 of the light-emitting device LD adjacent to the adhesive pattern AP10.

The difference between the light-emitting device array substrate 10 shown in FIG. 5 and the light-emitting device array substrate 50 shown in FIG. 10A to FIG. 10B lies in that: on the light-emitting device array substrate 50, each adhesive pattern AP10 may have open trenches TO, and the open trenches TO may divide the adhesive pattern AP10 into a plurality of portions, for example, 8 blocks, as shown in FIG. 10A.

Figure 11A:
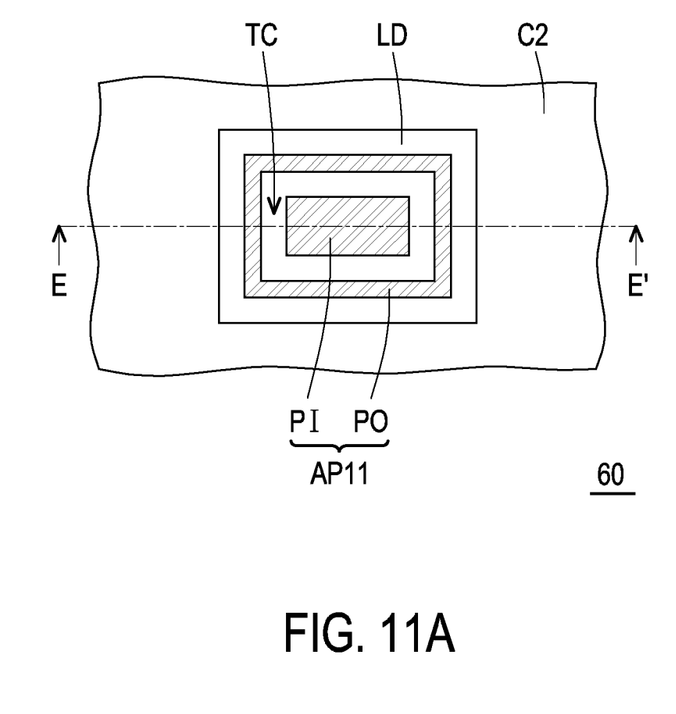
FIG. 11A is a partial schematic top view of a light-emitting device array substrate 60 according to an embodiment of the disclosure.
Figure 11B:
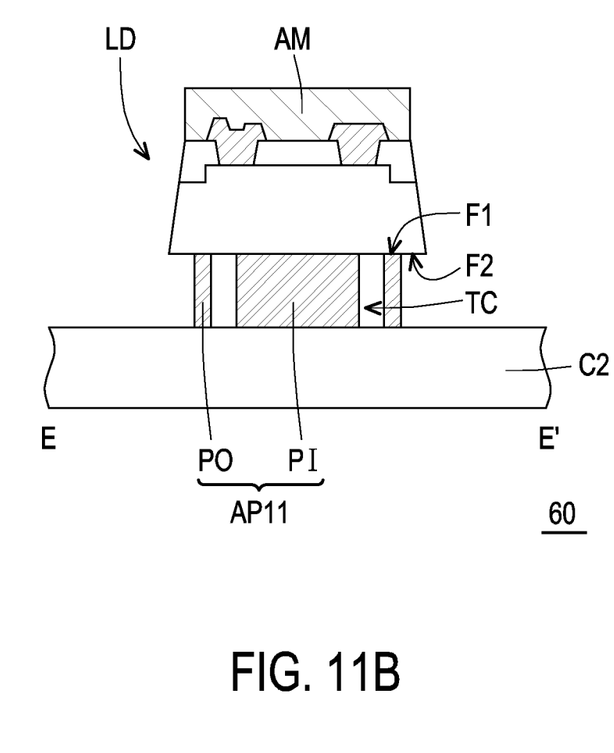
FIG. 11B is a cross-sectional schematic view taken long a cross-sectional line E-E' in FIG. 11A.

FIG. 11A is a partial schematic top view of a light-emitting device array substrate 60 according to an embodiment of the disclosure. FIG. 11B is a cross-sectional schematic view taken long a cross-sectional line E-E' in FIG. 11A. With reference to FIG. 11A to FIG. 11B, the light-emitting device array substrate 60 includes the carrier C2, a plurality of adhesive patterns AP11, and the plurality of light-emitting devices LD. The adhesive patterns AP11 are arranged in an array on the carrier C2. The light-emitting devices LD are disposed on the adhesive patterns AP11. Further, the area of the surface F1 of each adhesive pattern AP11 adjacent to the light-emitting device LD is less than or equal to the area of the surface F2 of the light-emitting device LD adjacent to the adhesive pattern AP11.

The difference between the light-emitting device array substrate 10 shown in FIG. 5 and the light-emitting device array substrate 60 shown in FIG. 11A to FIG. 11B lies in that: on the light-emitting device array substrate 60, each adhesive pattern AP11 may have a closed trench TC, and the closed trench TC may divide the adhesive pattern AP11 into two portions, for example, an inner portion PI and an outer portion PO. In this way, during subsequent removal of the adhesive material AM, only the outer portion PO is completely removed, that is, the smaller inner portion PI is left, and the screening standard of the adhesive pattern AP11 for the light-emitting device LD is further improved.

In view of the foregoing, in the light-emitting device array substrate and the method for fabricating the same provided by the disclosure, by making the area of the surface of each adhesive pattern adjacent to the light-emitting device smaller than or equal to the area of the surface of the light-emitting device adjacent to the adhesive pattern, the defective light-emitting device as well as the light-emitting device with an excessively large offset may be screened out. Further, in the method for fabricating the light-emitting device array substrate provided by the disclosure, by allowing the adhesive patterns to be reduced when the adhesive material is removed, the light-emitting device with a large offset may be further removed without additional processes, and only the light-emitting device with high transfer accuracy is left.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A light-emitting device array substrate, comprising:
   a carrier;
   a plurality of adhesive patterns arranged in an array on the carrier; and
   a plurality of light-emitting devices, wherein each of the light-emitting devices is disposed on a first adhesive pattern among the adhesive patterns, wherein an area of a first surface of each of the first adhesive patterns adjacent to the light-emitting device is less than or equal to an area of a second surface of the light-emitting device adjacent to the first adhesive pattern, and a first spacing between a geometric center of a first light-emitting device among the light-emitting devices and a symmetrical center of the first adhesive pattern under the first light-emitting device is different from a second spacing between a geometric center of a second light-emitting device among the light-emitting devices and a symmetrical center of the first adhesive pattern under the second light-emitting device.

2. The light-emitting device array substrate according to claim 1, wherein the area of the first surface is greater than or equal to 4% of the area of the second surface.

3. The light-emitting device array substrate according to claim 1, wherein the first spacing is not greater than 10% of a length of the first light-emitting device.

4. The light-emitting device array substrate according to claim 1, wherein the adhesive patterns are separated from one another.

5. The light-emitting device array substrate according to claim 1, wherein each of the adhesive patterns has an opening.

6. The light-emitting device array substrate according to claim 1, wherein each of the adhesive patterns has a trench.

7. The light-emitting device array substrate according to claim 1, wherein a second adhesive pattern among the adhesive patterns is not provided with the light-emitting devices.

8. The light-emitting device array substrate according to claim 1, further comprising an adhesive material covering the light-emitting devices.

9. A method for fabricating a light-emitting device array substrate, comprising:
providing a first carrier, wherein a plurality of light-emitting devices are disposed on the first carrier;
providing a second carrier, wherein a plurality of adhesive patterns are arranged in an array on the second carrier; and
transferring the light-emitting devices from the first carrier to the second carrier and arranging each of first light-emitting devices among the light-emitting devices on a first adhesive pattern among the adhesive patterns, wherein an area of a first surface of each of the first adhesive patterns adjacent to the first light-emitting device is less than or equal to an area of a second surface of the first light-emitting device adjacent to the first adhesive pattern, and a first spacing between a geometric center of a first sub-light-emitting device among the first light-emitting devices and a symmetrical center of the first adhesive pattern under the first sub-light-emitting device is different from a second spacing between a geometric center of a second sub-light-emitting device among the first light-emitting devices and a symmetrical center of the first adhesive pattern under the second sub-light-emitting device.

10. The method for fabricating the light-emitting device array substrate according to claim 9, wherein the light-emitting devices are disposed on the first carrier through an adhesive material.

11. The method for fabricating the light-emitting device array substrate according to claim 10, further comprising removing the adhesive material after transferring the light-emitting devices from the first carrier to the second carrier.

12. The method for fabricating the light-emitting device array substrate according to claim 11, wherein portions of the adhesive patterns are removed at the same time when the adhesive material is removed.

13. The method for fabricating the light-emitting device array substrate according to claim 12, wherein the area of the first surface is reduced by 5% to 50% after the adhesive material is removed.

14. The method for fabricating the light-emitting device array substrate according to claim 11, wherein a third sub-light-emitting device among the first light-emitting devices is removed at the same time when the adhesive material is removed.

* * * * *